United States Patent
Yim et al.

(10) Patent No.: US 7,288,835 B2
(45) Date of Patent: Oct. 30, 2007

(54) INTEGRATED CIRCUIT PACKAGE-IN-PACKAGE SYSTEM

(75) Inventors: Choong Bin Yim, Seongnam-si (KR); Hyeog Chan Kwon, Seoul (KR); Jong-Woo Ha, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 11/276,941

(22) Filed: Mar. 17, 2006

(65) Prior Publication Data

US 2007/0216005 A1    Sep. 20, 2007

(51) Int. Cl.
*H01L 23/02* (2006.01)
*H01L 23/48* (2006.01)
*H01L 21/00* (2006.01)

(52) U.S. Cl. .................. 257/685; 257/686; 257/777; 257/E27.137; 257/E27.144; 257/E21.161; 257/E25.006; 257/E23.013; 257/E25.021; 257/E25.027; 257/E23.085; 438/109; 438/110

(58) Field of Classification Search .............. 257/685, 257/686, 777, 778, E27.137, E27.144, E27.161, 257/E25.006, E25.013, E25.018; 438/109, 438/110, 368 FOR, 426 FOR
See application file for complete search history.

(56) References Cited

U.S. PATENT DOCUMENTS

| | | | |
|---|---|---|---|
| 6,936,922 B1 | 8/2005 | Park et al. | |
| 6,946,323 B1 | 9/2005 | Heo | |
| 6,967,395 B1 | 11/2005 | Glenn et al. | |
| 6,972,481 B2 | 12/2005 | Karnezos | |
| 2004/0232559 A1* | 11/2004 | Adelmann | 257/777 |
| 2005/0010725 A1* | 1/2005 | Eilert | 711/132 |
| 2006/0006518 A1 | 1/2006 | Bolken et al. | |
| 2006/0063283 A1* | 3/2006 | Cobbley et al. | 438/14 |
| 2006/0220206 A1* | 10/2006 | Gerber et al. | 257/686 |

* cited by examiner

*Primary Examiner*—Jasmine Clark
(74) *Attorney, Agent, or Firm*—Mikio Ishimaru

(57) ABSTRACT

An integrated circuit package-in-package system is provided forming a first integrated circuit package having a first interface, stacking a second integrated circuit package having a second interface above the first integrated circuit package, fitting the first interface and the second interface, and attaching a third integrated circuit package on the second integrated circuit package.

17 Claims, 5 Drawing Sheets

INTEGRATED CIRCUIT PACKAGE-IN-PACKAGE SYSTEM

TECHNICAL FIELD

The present invention relates generally to integrated circuit packages and more particularly to integrated circuit package-in-package.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

In response to the demands for improved packaging, many innovative package designs have been conceived and brought to market. The multi-chip module has achieved a prominent role in reducing the board space. Numerous package approaches stack multiple integrated circuit, package level stacking, or package-on-package (POP). Known-good-die (KGD) and assembly process yields are not an issue since each package can be tested prior to assembly, allowing KGD to be used in assembling the stack. But stacking integrated devices, package-in-package, or combination thereof have system level difficulties.

Thus, a need still remains for the integrated circuit package system providing low cost manufacturing as well as flexibility for different stacking configurations. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package-in-package system including forming a first integrated circuit package having a first interface, stacking a second integrated circuit package having a second interface above the first integrated circuit package, fitting the first interface and the second interface, and attaching a third integrated circuit package on the second integrated circuit package.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
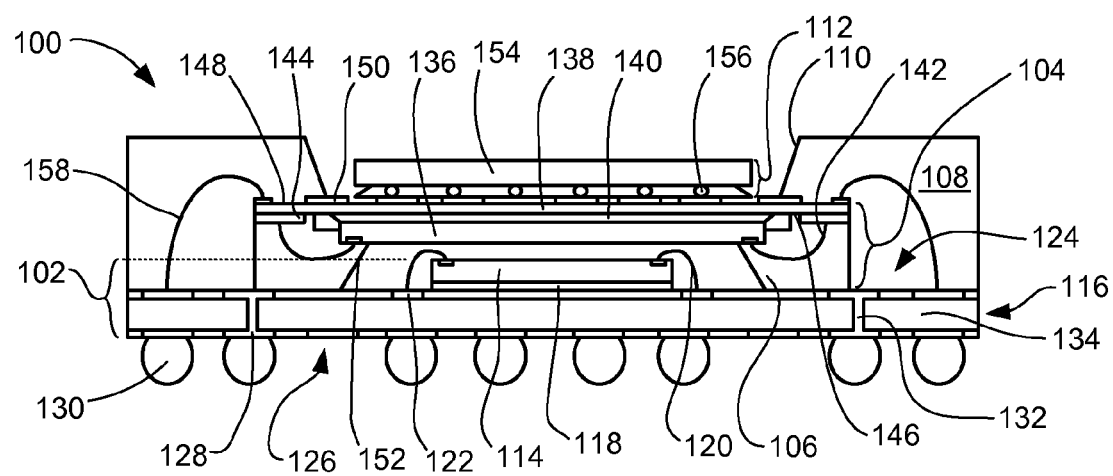
FIG. 1 is a cross-sectional view of a first integrated circuit package-in-package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of a first integrated circuit package-in-package system 100 in an embodiment of the present invention. A first integrated circuit package 102, such as an integrated circuit die, is the bottom package. A second integrated circuit package 104 having a first encapsulation 106 is above the first integrated circuit package 102. A package encapsulation 108 having a recess 110 covers the second integrated circuit package 104. A third integrated circuit package 112 is in the recess 110 above the first integrated circuit package 102 and mounted on the second integrated circuit package 104.

The first integrated circuit package 102 includes a first integrated circuit die 114 attached on a first substrate 116 with a first adhesive 118. First interconnects 120, such as bond wires, connect between the first integrated circuit die 114 and bond pads 122 of the first substrate 116.

The first substrate 116, such as an organic or inorganic substrate, includes a top metal layer 124 having the bond pads 122 and a bottom metal layer 126 having contact sites 128 for attaching external interconnects 130. The external interconnects 130, such as solder balls, connect to the next system level (not shown), such as a printed circuit board. Electrical vias 132 connect the top metal layer 124 and the bottom metal layer 126 in a predetermined configuration. An insulation 134 separates the top metal layer 124 and the bottom metal layer 126, traces (not shown) of the top metal layer 124 from each other, traces (not shown) of the bottom metal layer 126 from each other, and the electrical vias 132 from each other.

The second integrated circuit package 104 includes a second integrated circuit die 136 attached on a second substrate 138 with a second adhesive 140. Second interconnects 142, such as bond wires, connect between the second integrated circuit die 136 and bond fingers 144 of the second substrate 138.

The second substrate 138 includes a first side 146 and a second side 148. The first side 146 includes the bond fingers 144. The bond fingers 144 are at the boundary of the first side 146. The second side 148 includes terminal pads 150 for further connections. The terminal pads 150 may be at the boundary of the second side 148 as well as in an interior of the second side 148. The terminal pads 150 in the interior may be in an array configuration.

The first encapsulation 106 covers the second interconnects 142 and has a cavity 152 exposing an inner area of the second integrated circuit die 136. With the second integrated circuit package 104 on the first integrated circuit package 102, the first integrated circuit die 114 and the first interconnects 120 are in the cavity 152. The first encapsulation 106 is on the first substrate 116. A first interface, such as a physical interface, of the first integrated circuit package 102 is defined by physical dimensions of the first integrated circuit die 114 and the first interconnects 120. The second interface, such as a physical interface, of the second integrated circuit package 104 is defined by the cavity 152.

The third integrated circuit package 112, such as a flip chip, includes a third integrated circuit die 154 having third interconnects 156 thereon. The third integrated circuit package 112 is in the recess 110 and mounts on the second substrate 138 with the third interconnects 156 attached to a portion of the terminal pads 150 of the second substrate 138.

Fourth interconnects 158, such as bond wires, connect between the terminal pads 150 at the boundary of the second side 148 of the second substrate 138 and the bond pads 122 of the first substrate 116. The package encapsulation 108 covers the fourth interconnects 158 with the terminal pads 150 at the boundary of the second side 148 and partially covers the second integrated circuit package 104 exposing an inner area of the second side 148.

Figure 2:
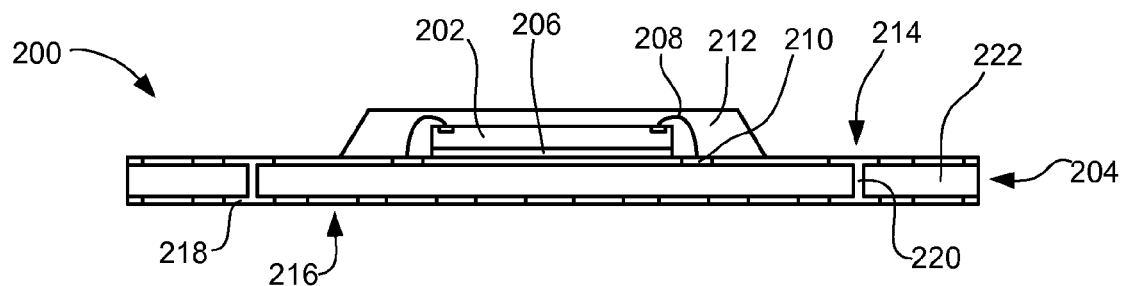
FIG. 2 is a cross-sectional view of a first bottom integrated circuit package, an alternative to the first integrated circuit package of FIG. 1.

Referring now to FIG. 2, therein is shown a cross-sectional view of a first bottom integrated circuit package 200, an alternative to the first integrated circuit package 102 of FIG. 1. The first bottom integrated circuit package 200 includes a first integrated circuit die 202 attached on a first substrate 204 with a first adhesive 206. First interconnects 208, such as bond wires, connect between the first integrated circuit die 202 and bond pads 210 of the first substrate 204. A bottom package encapsulation 212 covers the first integrated circuit die 202 and the first interconnects 208. A first interface, such as a physical interface, of the first bottom integrated circuit package 200 is defined by physical dimensions of the bottom package encapsulation 212. The structure of the bottom package encapsulation 212 fits into the cavity 152 of FIG. 1.

The first substrate 204, such as an organic or inorganic substrate, includes a top metal layer 214 having the bond pads 210 and a bottom metal layer 216 having contact sites 218 for further connections. Electrical vias 220 connect the top metal layer 214 and the bottom metal layer 216 in a predetermined configuration. An insulation 222 separates the top metal layer 214 and the bottom metal layer 216, traces (not shown) of the top metal layer 214 from each other, traces (not shown) of the bottom metal layer 216 from each other, and the electrical vias 220 from each other.

Figure 3:
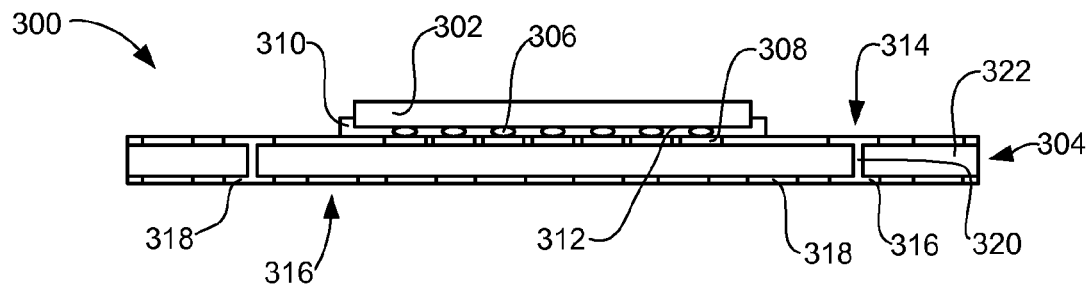
FIG. 3 is a cross-sectional view of a second bottom integrated circuit package, another alternative to the first integrated circuit package of FIG. 1.

Referring now to FIG. 3, therein is shown a cross-sectional view of a second bottom integrated circuit package 300, another alternative to the first integrated circuit package 102 of FIG. 1. The second bottom integrated circuit package 300 includes a first integrated circuit die 302, such as a flip chip, attached on a first substrate 304. First interconnects 306, such as solder bumps, connect between the first integrated circuit die 302 and a portion of bond pads 308 in an array configuration of the first substrate 304. An underfill encapsulation 310 covers an active side 312 of the first integrated circuit die 302 and the first interconnects 306. A first interface, such as a physical interface, of the second bottom integrated circuit package 300 is defined by physical dimensions of the first integrated circuit die 302. The first integrated circuit die 302 and the first interconnects 306 fit into the cavity 152 of FIG. 1.

The first substrate 304, such as an organic or inorganic substrate, includes a top metal layer 314 having the bond pads 308 and a bottom metal layer 316 having contact sites 318 for further connections. Electrical vias 320 connect the top metal layer 314 and the bottom metal layer 316 in a predetermined configuration. An insulation 322 separates the top metal layer 314 and the bottom metal layer 316, traces (not shown) of the top metal layer 314 from each other, traces (not shown) of the bottom metal layer 316 from each other, and the electrical vias 320 from each other.

Figure 4:
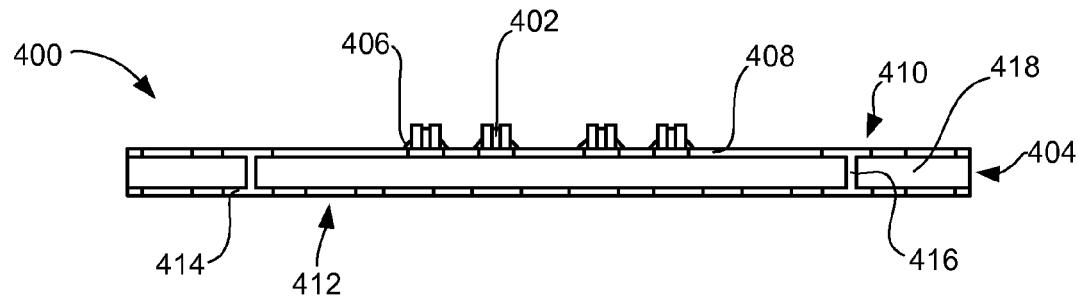
FIG. 4 is a cross-sectional view of a third bottom integrated circuit package, yet another alternative to the first integrated circuit package of FIG. 1.

Referring now to FIG. 4, therein is shown a cross-sectional view of a third bottom integrated circuit package 400, yet another alternative to the first integrated circuit package 102 of FIG. 1. The third bottom integrated circuit package 400 includes devices 402, such as small packaged components or passive components, attached on a first substrate 404. First interconnects 406, such as solder, connect between the devices 402 and a portion of bond pads 408 of the first substrate 404. A first interface, such as a physical interface, of the third bottom integrated circuit package 400 is defined by physical dimensions of the devices 402, mounted on the first substrate 404. The devices 402 fit into the cavity 152 of FIG. 1.

The first substrate 404, such as an organic or inorganic substrate, includes a top metal layer 410 having the bond pads 408 and a bottom metal layer 412 having contact sites 414 for further connections. Electrical vias 416 connect the top metal layer 410 and the bottom metal layer 412 in a predetermined configuration. An insulation 418 separates the top metal layer 410 and the bottom metal layer 412, traces (not shown) of the top metal layer 410 from each other, traces (not shown) of the bottom metal layer 412 from each other, and the electrical vias 416 from each other.

Figure 5:
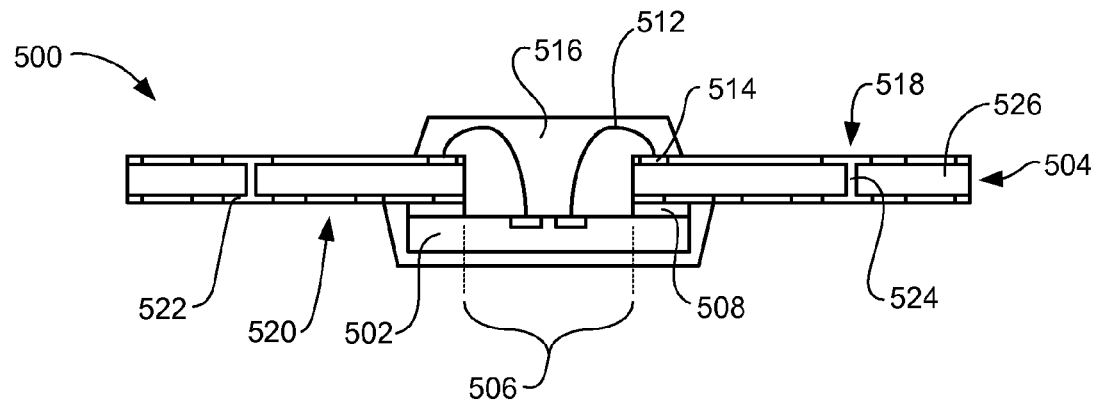
FIG. 5 is a cross-sectional view of a fourth bottom integrated circuit package, yet another alternative to the first integrated circuit package of FIG. 1.

Referring now to FIG. 5, therein is shown a cross-sectional view of a fourth bottom integrated circuit package 500, yet another alternative to the first integrated circuit package 102 of FIG. 1. The fourth bottom integrated circuit package 500 includes a first integrated circuit die 502 and a first substrate 504 having an opening 506. An adhesive 508 attaches the first integrated circuit die 502 to a bottom side of the first substrate 504 under the opening 506. First interconnects 512, such as bond wires, connect through the opening 506 between the first integrated circuit die 502 and bond pads 514 next to the opening 506 on a top side of the first substrate 504. An encapsulation 516 covers the first integrated circuit die 502, the first interconnects 512, and the opening 506. The bond pads 514 connected to the first interconnects 512 are also covered by the encapsulation 516. A first interface, such as a physical interface, of the fourth bottom integrated circuit package 500 is defined by physical dimensions of a portion of the encapsulation 516 above the first substrate 504. The encapsulation 516 extending above the top side of the first substrate 504 fits into the cavity 152 of FIG. 1.

The first substrate 504, such as an organic or inorganic substrate, includes a top metal layer 518 having the bond pads 514 and a bottom metal layer 520 having contact sites 522 for further connections. Electrical vias 524 connect the top metal layer 518 and the bottom metal layer 520 in a predetermined configuration. An insulation 526 separates the top metal layer 518 and the bottom metal layer 520, traces (not shown) of the top metal layer 518 from each other, traces (not shown) of the bottom metal layer 520 from each other, and the electrical vias 524 from each other.

Figure 6:
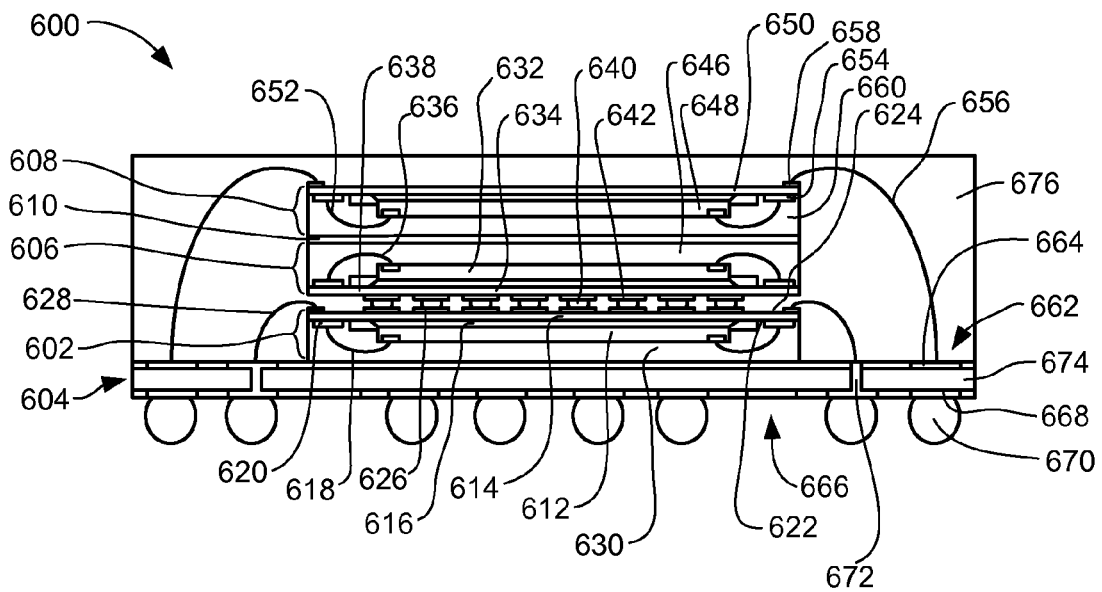
FIG. 6 is a cross-sectional view of a second integrated circuit package-in-package system in an alternative embodiment of the present invention.

Referring now to FIG. 6, therein is shown a cross-sectional view of a second integrated circuit package-in-package system 600 in an alternative embodiment of the present invention. A first integrated circuit package 602, such as a pre-molded integrated circuit package, is a bottom package and on a package substrate 604. A second integrated circuit package 606, such as a pre-molded integrated circuit package, is above the first integrated circuit package 602. A third integrated circuit package 608, such as a pre-molded integrated circuit package, is above the first integrated circuit package 602 and attached with a stacking adhesive 610 onto the second integrated circuit package 606.

The first integrated circuit package 602 includes a first integrated circuit die 612 attached on a first substrate 614 with a first adhesive 616. First interconnects 618, such as bond wires, connect between the first integrated circuit die 612 and first bond fingers 620 of the first substrate 614.

The first substrate 614 includes a first side 622 and a second side 624. The boundary of the first side 622 includes the first bond fingers 620. The second side 624 includes first terminal pads 626 for further connections. The first terminal pads 626 may be at the boundary of the second side 624 as well as in the interior of the second side 624. The first terminal pads 626 in the interior may be in an array configuration. A first interface, such as a first electrical interface pattern, is defined by the first terminal pads 626.

First package interconnects 628, such as bond wires, connect between the first terminal pads 626 and the package substrate 604. A first encapsulation 630 covers the first integrated circuit die 612 and the first interconnects 618 on the first substrate 614.

The second integrated circuit package 606 has a similar structure to the first integrated circuit package 602. The second integrated circuit package 606 includes a second integrated circuit die 632 on a second substrate 634. Second interconnects 636, such as bond wires, connect between the second integrated circuit die 632 and second bond fingers 638 of the second substrate 634. Stacking interconnects 640, such as solder bumps, connect second terminal pads 642 of the second substrate 634 to the first terminal pads 626 of the first substrate 614 in a predetermined configuration. A second interface, such as a second electrical interface pattern, is defined by the second terminal pads 642. A second encapsulation 646 covers the second integrated circuit die 632 and the second interconnects 636 on the second substrate 634.

The third integrated circuit package 608 has a similar structure to the first integrated circuit package 602. The third integrated circuit package 608 includes a third integrated circuit die 648 on a third substrate 650. Third interconnects 652, such as bond wires, connect between the third integrated circuit die 648 and third bond fingers 654 of the third substrate 650. Second package interconnects 656, such as bond wires, connect third terminal pads 658 of the third substrate 650 to the package substrate 604 in a predetermined configuration. A third interface, such as a third electrical interface pattern, is defined by the third terminal pads 658. A third encapsulation 660 covers the third integrated circuit die 648 and the third interconnects 652 on the third substrate 650.

The package substrate 604, such as an organic or inorganic substrate, includes a top metal layer 662 having the bond pads 664 and a bottom metal layer 666 having contact sites 668 for attaching external interconnects 670. The external interconnects 670, such as solder balls, connect to the next system level (not shown), such as a printed circuit board. Electrical vias 672 connect the top metal layer 662 and the bottom metal layer 666 in a predetermined configuration. An insulation 674 separates the top metal layer 662 and the bottom metal layer 666, traces (not shown) of the top metal layer 662 from each other, traces (not shown) of the bottom metal layer 666 from each other, and the electrical vias 672 from each other. A package encapsulation 676 covers the first integrated circuit package 602, the second integrated circuit package 606, the third integrated circuit package 608, the first package interconnects 628 and the second package interconnects 656 on the package substrate 604.

Figure 7:
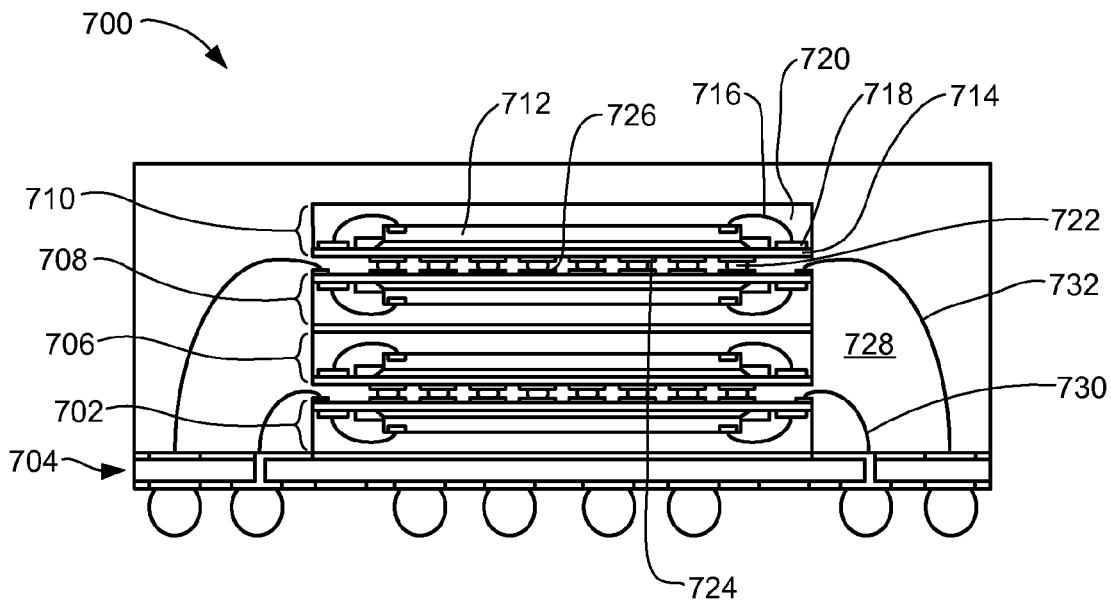
FIG. 7 is a cross-sectional view of a third integrated circuit package-in-package system in another alternative embodiment of the present invention.

Referring now to FIG. 7, therein is shown a cross-sectional view of a third integrated circuit package-in-package system 700 in another alternative embodiment of the present invention. Similarly, the third integrated circuit package-in-package system 700 includes a first integrated circuit package 702 on a package substrate 704, a second integrated circuit package 706 above the first integrated circuit package 702, and a third integrated circuit package 708 on the second integrated circuit package 706. The first integrated circuit package 702, the second integrated circuit package 706, and the third integrated circuit package 708 are similar in structure and stacking configuration to the first integrated circuit package 602 of FIG. 6, the second integrated circuit package 606 of FIG. 6, and the third integrated circuit package 608 of FIG. 6, respectively.

The fourth integrated circuit package 710 has a similar structure to the second integrated circuit package 706. The fourth integrated circuit package 710 includes a fourth integrated circuit die 712 on a fourth substrate 714. Fourth interconnects 716, such as bond wires, connect between the fourth integrated circuit die 712 and fourth bond fingers 718 of the fourth substrate 714. A fourth encapsulation 720 covers the fourth integrated circuit die 712 and the fourth interconnects 716 on the fourth substrate 714.

Stacking interconnects 722, such as solder bumps, connect fourth terminal pads 724 of the fourth substrate 714 to third terminal pads 726 of the third integrated circuit package 708 in a predetermined configuration. A third interface, such as a third electrical interface pattern, is defined by the third terminal pads 726. A fourth interface, such as a fourth electrical interface pattern, is defined by the fourth terminal pads 724. The stacking interconnects 722 also connect the first integrated circuit package 702 and the second integrated circuit package 706. A package encapsulation 728 covers the first integrated circuit package 702, the second integrated circuit package 706, the third integrated circuit package 708, the fourth integrated circuit package 710, first package interconnects 730 and second package interconnects 732 on the package substrate 704.

Figure 8:
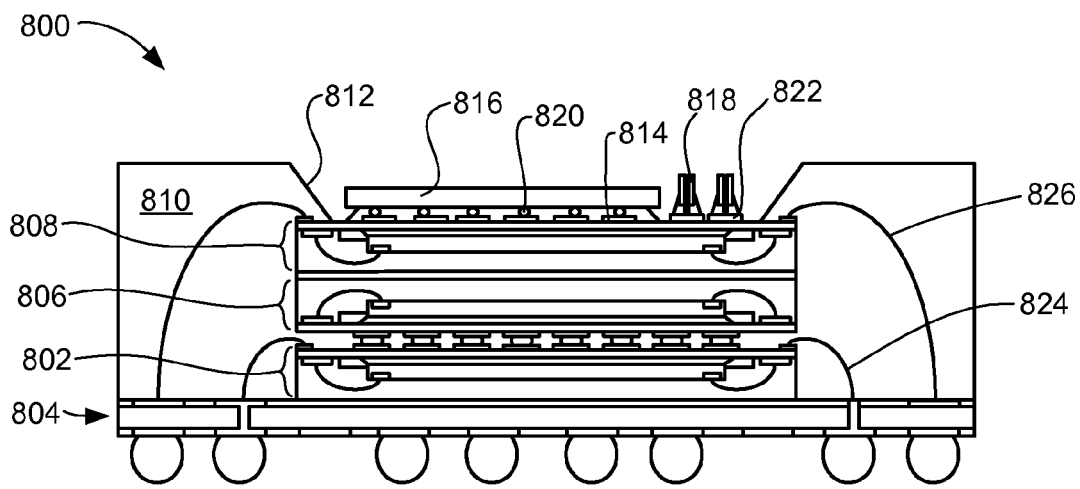
FIG. 8 is a cross-sectional view of a fourth integrated circuit package-in-package system in yet another alternative embodiment of the present invention.

Referring now to FIG. 8, therein is shown a cross-sectional view of a fourth integrated circuit package-in-package system 800 in yet another alternative embodiment of the present invention. Similarly, the fourth integrated circuit package-in-package system 800 includes a first integrated circuit package 802 on a package substrate 804, a second integrated circuit package 806 above the first integrated circuit package 802, and a third integrated circuit package 808 on the second integrated circuit package 806. The first integrated circuit package 802, the second integrated circuit package 806, and the third integrated circuit package 808 are similar in structure and stacking configuration to the first integrated circuit package 602 of FIG. 6, the second integrated circuit package 606 of FIG. 6, and the third integrated circuit package 608 of FIG. 6, respectively.

A package encapsulation 810 having a recess 812 partially covers the third integrated circuit package 808 and exposes third terminal pads 814 of the third integrated circuit package 808 for further connections. A third interface, such as a third electrical interface pattern, is defined by the third terminal pads 814. A fourth integrated circuit die 816 and devices 818, such as small package devices, are in the recess 812 and mounts on the third integrated circuit package 808. Fourth interconnects 820, such as solder bumps, of the fourth integrated circuit die 816 attach to the third terminal pads 814 in a predetermined configuration. Fifth interconnects 822, such as solder, connect the devices 818 on the third terminal pads 814 in a predetermined configuration. A portion of a fourth interface, such as a fourth electrical interface pattern, is defined by the fourth interconnects 820. Another portion of the fourth interface is defined by the fifth interconnects 822. The package encapsulation 810 also covers the first integrated circuit package 802, the second integrated circuit package 806, first package interconnects 824 and second package interconnects 826 on the package substrate 804.

Figure 9:
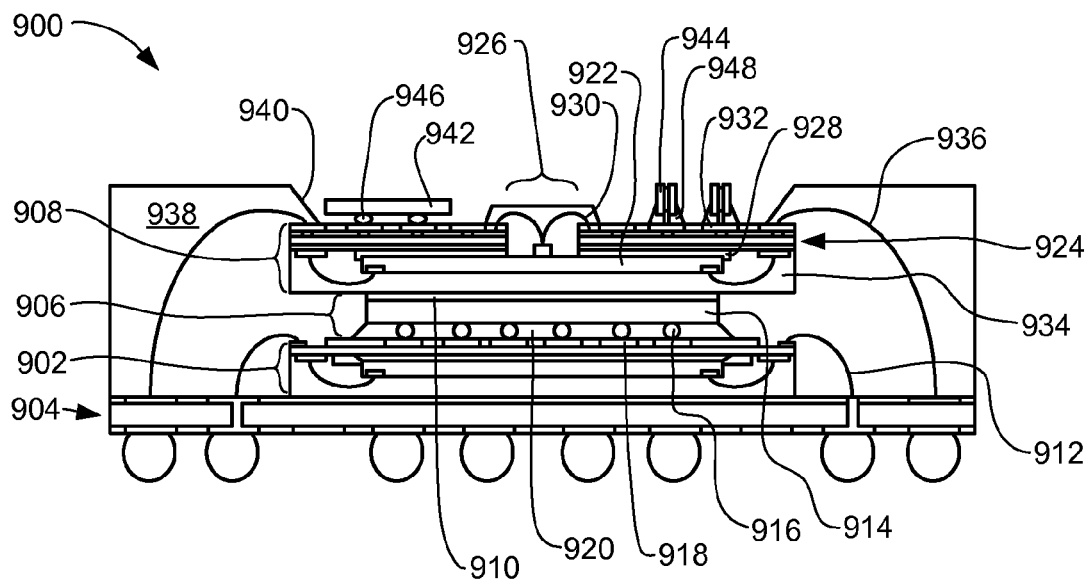
FIG. 9 is a cross-sectional view of a fifth integrated circuit package-in-package system in yet another alternative embodiment of the present invention.

Referring now to FIG. 9, therein is shown a cross-sectional view of a fifth integrated circuit package-in-package system 900 in yet another alternative embodiment of the present invention. A first integrated circuit package 902, such as a pre-molded integrated circuit package, is a bottom package and on a package substrate 904. A second integrated circuit package 906, such as a flip chip, is above the first integrated circuit package 902. A third integrated circuit package 908, such as a pre-molded integrated circuit package with a board on chip (BOC) configuration, is above the first integrated circuit package 902 and attached with a stacking adhesive 910 on the second integrated circuit package 906.

The first integrated circuit package 902 is similar in structure to the first integrated circuit package 602 of FIG. 6 and connected to the package substrate 904 with first package interconnects 912. The second integrated circuit package 906 includes a second integrated circuit die 914 having second interconnects 916, such as solder bumps, provided thereon. The second interconnects 916 attach to first terminal pads 918 of the first integrated circuit package 902 in a predetermined configuration. A first interface, such as a first electrical interface pattern, is defined by the first terminal pads 918. A second interface, such as a second electrical interface pattern, is defined by the second interconnects 916. An underfill encapsulation 920 covers the second interconnects 916.

The third integrated circuit package 908 includes a third integrated circuit die 922 and a third substrate 924 having an opening 926. An adhesive 928 attaches the third integrated circuit die 922 to a bottom side of the third substrate 924 under the opening 926. Third interconnects 930, such as bond wires, connect through the opening 926 between the third integrated circuit die 922 and third terminal pads 932 next to the opening 926 on a top side of the third substrate 924. A third interface, such as a third electrical interface pattern, is defined by the third terminal pads 932. A third encapsulation 934 covers the third integrated circuit die 922, the third interconnects 930, and the opening 926. The third integrated circuit package 908 attaches to the second integrated circuit die 914 with the stacking adhesive 910. Second package interconnects 936, such as bond wires, connect between the third terminal pads 932 at the boundary of the third substrate 924 and the package substrate 904.

A package encapsulation 938 having a recess 940 partially covers the third integrated circuit package 908 and exposes third terminal pads 932 for further connections. A fourth integrated circuit die 942 and devices 944, such as small package devices, are in the recess 940 and mounts on the third integrated circuit package 908. Fourth interconnects 946, such as solder bumps, of the fourth integrated circuit die 942 attach to the third terminal pads 932 in a predetermined configuration. Fifth interconnects 948, such as solder, connect the devices 944 on the third terminal pads 932 in a predetermined configuration. A portion of a fourth interface, such as a fourth electrical interface pattern, is defined by the fourth interconnects 946. Another portion of the fourth interface is defined by the fifth interconnects 948. The package encapsulation 938 also covers the first integrated circuit package 902, the second integrated circuit package 906, the first package interconnects 912 and the second package interconnects 936 on the package substrate 904.

Figure 10:
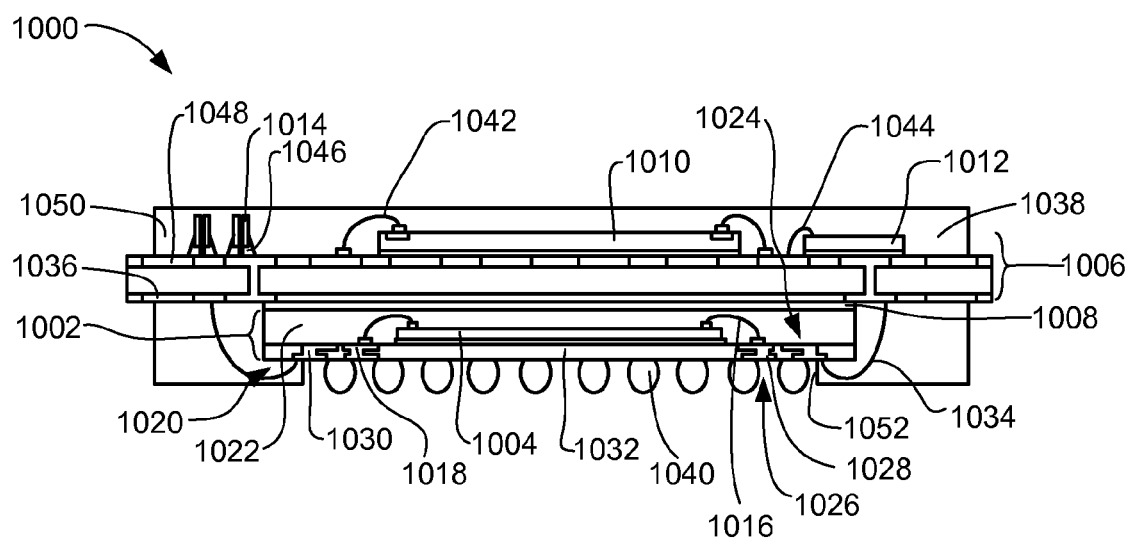
FIG. 10 is a cross-sectional view of a fifth integrated circuit package-in-package system in yet another alternative embodiment of the present invention.

Referring now to FIG. 10, therein is shown a cross-sectional view of a fifth integrated circuit package-in-package system 1000 in yet another alternative embodiment of the present invention. A first integrated circuit package 1002 having a first integrated circuit die 1004 is below and attached to a second integrated circuit package 1006 with an adhesive 1008. The second integrated circuit package 1006 includes a second integrated circuit die 1010. A third integrated circuit die 1012, and devices 1014, such as small packaged components, are above the first integrated circuit package 1002.

First interconnects 1016, such as bond wires, connect between the first integrated circuit die 1004 and bond fingers 1018 of a first substrate 1020 of the first integrated circuit package 1002. A first encapsulation 1022 covers the first integrated circuit die 1004 and the first interconnects 1016.

The first substrate 1020, such as an organic or inorganic substrate, includes a first metal layer 1024 having the bond fingers 1018 and a second metal layer 1026 having terminal pads 1028 for further connections. First electrical vias 1030 connect the first metal layer 1024 and the second metal layer 1026 in a predetermined configuration. A first insulation 1032 separates the first metal layer 1024 and the second metal layer 1026, traces (not shown) of the first metal layer 1024 from each other, traces (not shown) of the second metal layer 1026 from each other, and the first electrical vias 1030 from each other.

Package interconnects 1034 connect between the terminal pads 1028 and bottom contact sites 1036 of a second substrate 1038 of the second integrated circuit package 1006. External interconnects 1040 attach to the terminal pads 1028 in a predetermined configuration.

The third integrated circuit die 1012 attaches to the second substrate 1038 with the adhesive 1008. Second interconnects 1042, such as bond wires, third interconnects 1044, such as bond wires, and fourth interconnects 1046, such as solder, connect the second integrated circuit die 1010, the third integrated circuit die 1012, and the devices 1014, respectively, to top contact sites 1048 of the second substrate 1038 in a predetermined configuration.

A package encapsulation 1050 covers the second integrated circuit die 1010, the third integrated circuit die 1012, and the devices 1014 on a top side of the second substrate 1038. The package interconnects 1034 are also covered by the package encapsulation 1050 on a bottom side of the second substrate 1038. The package encapsulation 1050 also partially covers the first integrated circuit package 1002 forming a recess 1052 and exposing the external interconnects 1040. The package encapsulation 1050 does not impede the connections of the external interconnects 1040 to the next system level (not show), such as a printed circuit board.

Figure 11:
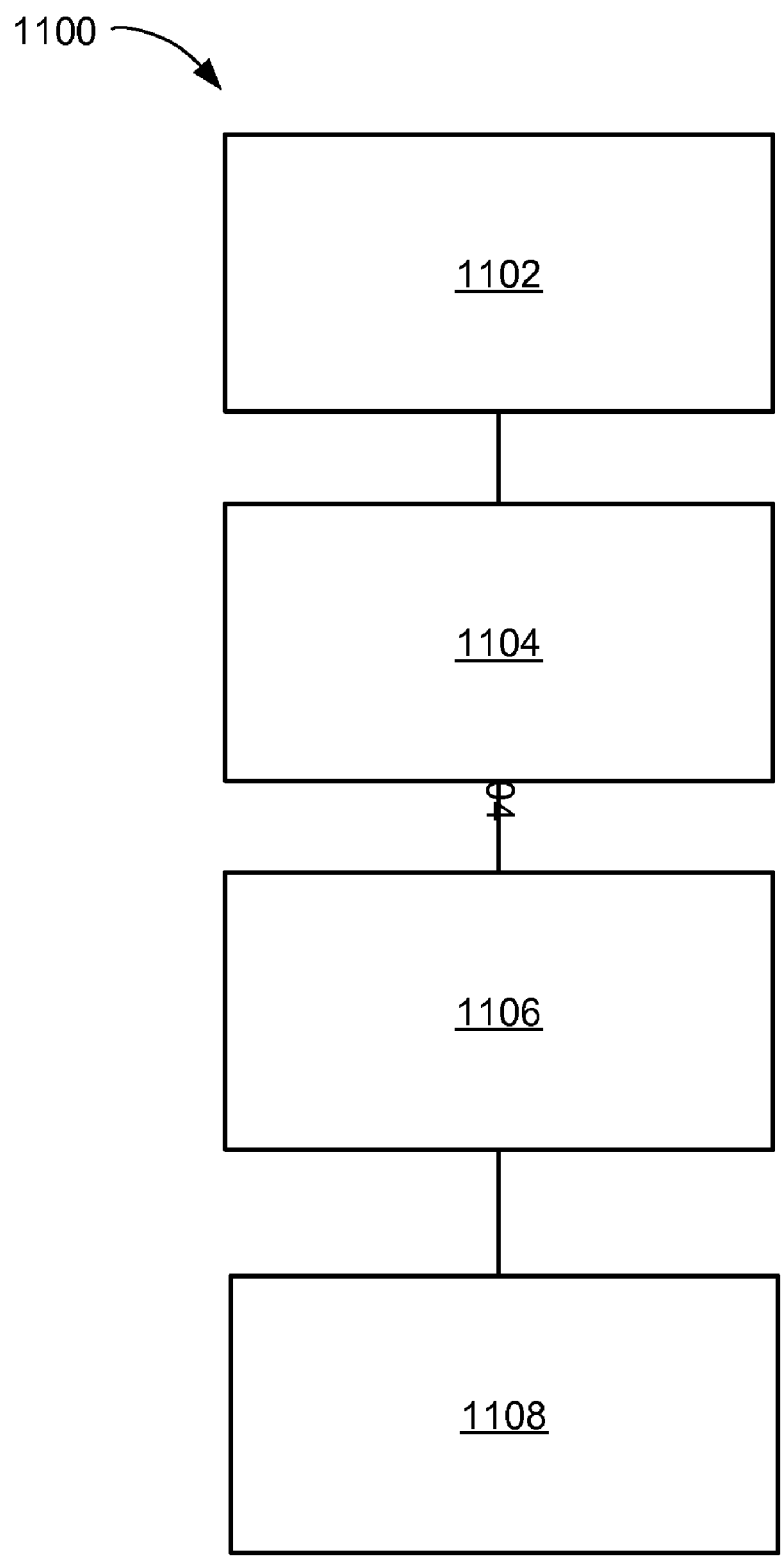
FIG. 11 is a flow chart of an integrated circuit package-in-package system for the integrated circuit package-in-package system in an embodiment of the present invention.

Referring now to FIG. 11, therein is shown a flow chart of an integrated circuit package-in-package system 1100 for the integrated circuit package-in-package system in an embodiment of the present invention. The system 1100 includes forming a first integrated circuit package having a first interface in a block 1102; stacking a second integrated circuit package having a second interface above the first integrated circuit package in a block 1104; fitting the first interface and the second interface in a block 1106; and attaching a third integrated circuit package on the second integrated circuit package in a block 11108.

It has been discovered that the present invention thus has numerous aspects.

It has been discovered that the present invention may form package stack structures with decreased package height utilizing both package-in-package and package on package stacking configurations.

An aspect is that the present invention provides a cavity used in the package-in-package structure allows for package stacking requiring minimum or no additional height due to a package fitting into the cavity of another package. A recess used in the package on package structure allows for package stacking on other packages also requiring minimum or no additional height due to a stacking package fitting into the recess of another package. Both package stacking configurations are accomplished using tested known good devices (KGD) to improve manufacture yield and lower cost of the resulting package structure.

Another aspect of the present invention is that the encapsulation and stacking interconnects also serving as spacers. The connected packages with complementary pin out and terminal pad pitch allow use of the stacking interconnects to connect the packages without the need of an additional interposer or redistribution structure. The stacking interconnects serve as spacer for additional electrical connections between the two connected packages. The encapsulation of each of the package allows the packages to be stacked in one orientation or vertically flipped. The stacking packages may be tested using only KGD in the package-in-package assembly. Manufacturing steps are simplified with steps removed, manufacturing yield is improved, and the overall cost of the package-in-package structure is reduced.

Thus, it has been discovered that the integrated circuit package-in-package system method of the present invention furnishes important and heretofore unknown and unavailable solutions, capabilities, and functional aspects for increasing chip density in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. An integrated circuit package-in-package system comprising:
   forming a first integrated circuit package having a first interface;
   stacking a second integrated circuit package having a second interface above the first integrated circuit package and including:
     forming a cavity in a first encapsulation of the second integrated circuit package, and
     forming the second interface defined by the cavity;
   fitting the first interface and the second interface;
   forming a second encapsulation to cover the first integrated circuit package and second integrated circuit package;
   forming a recess in the second encapsulation exposed a substrate of the second integrated circuit package;
   attaching a third integrated circuit package on the second integrated circuits package; and
   connecting the third integrated circuit package to the substrate.

2. The system as claimed in claim 1 wherein fitting the first interface and the second interface comprises:
   forming the first interface defined by a first electrical interface pattern on a first substrate of the first integrated circuit package;
   forming the second interface defined by a second electrical interface pattern on a second substrate of the second integrated circuit package; and
   mating the first electrical interface pattern and the second electrical interface pattern.

3. The system as claimed in claim 1 wherein:
forming the first integrated circuit package having the first interface comprises:
  forming the first interface defined by a first electrical interface pattern on a first substrate of the first integrated circuit package;
stacking the second integrated circuit package having the second interface further comprises:
  forming the second interface defined by a second electrical interface pattern on a second substrate of the second integrated circuit package;
fitting the first interface and the second interface further comprises:
  mating the first electrical interface pattern and the second electrical interface pattern;
attaching the third integrated circuit package on the second integrated circuit package further comprises:
  stacking the third integrated circuit package having a third electrical interface pattern on the second integrated circuit package; and
further comprising:
  stacking a fourth integrated circuit package having a fourth electrical interface pattern on the third integrated circuit package;
  mating the third electrical interface pattern and the fourth electrical interface pattern; and
  encapsulating the first integrated circuit package, the second integrated circuit package, the third integrated circuit package, and the fourth integrated circuit package.

4. The system as claimed in claim 1 wherein:
forming the first integrated circuit package having the first interface comprises:
  forming the first interface defined by a first electrical interface pattern on a first substrate of the first integrated circuit package;
stacking the second integrated circuit package having the second interface further comprises:
  forming the second interface defined by a second electrical interface pattern on a second substrate of the second integrated circuit package;
fitting the first interface and the second interface further comprises:
  mating the first electrical interface pattern and the second electrical interface pattern; and
attaching the third integrated circuit package on the second integrated circuit package further comprises:
  stacking the third integrated circuit package having a third electrical interface pattern on the second integrated circuit package; and
further comprising:
  forming an encapsulation to cover the first integrated circuit package, the second integrated circuit package, and the third integrated circuit package;
  forming a recess in the encapsulation to expose the third electrical interface pattern on a third substrate of the third integrated circuit package;
  stacking a fourth integrated circuit package having a fourth electrical interface pattern in the recess on the third integrated circuit package; and
  mating a portion of the third electrical interface pattern and the fourth electrical interface pattern.

5. An integrated circuit package-in-package system comprising:
forming a first integrated circuit package having a first interface and including:
  forming the first interface defined by a first electrical interface pattern on a first substrate of the first integrated circuit package;
stacking a second integrated circuit package having a second interface above the first integrated circuit package and including:
  forming the second integrated circuit package with a second integrated circuit die having a second electrical interface pattern, and
  forming the second interface defined by the second electrical interface pattern;
fitting the first interface and the second interface;
electrically connecting the first integrated circuit package and the second integrated circuit package;
attaching a third integrated circuit package on the second integrated circuit package;
forming an encapsulation to cover the first integrated circuit package, the second integrated circuit package, and the third integrated circuit package;
forming a recess in the encapsulation to expose the third electrical interface pattern on a third substrate of the third integrated circuit package;
stacking a fourth integrated circuit package having a fourth electrical interface pattern in the recess on the third integrated circuit package; and
mating a portion of the third electrical interface pattern and the fourth electrical interface pattern.

6. The system as claimed in claim 5 wherein attaching the third integrated circuit package on the second integrated circuit package includes electrically connecting the third integrated circuit package and the second integrated circuit package.

7. The system as claimed in claim 5 further comprising mounting the first integrated circuit package on a package substrate.

8. The system as claimed in claim 5 further comprising electrically connecting the first integrated circuit package and a package substrate.

9. An integrated circuit package-in-package system comprising:
  a first integrated circuit package having a first interface;
  a second integrated circuit package having a second interface above the first integrated circuit package and including:
    a cavity in a first encapsulation of the second integrated circuit package, and the second interface defined by the cavity;
  the first interface fitted with the second interface;
  a third integrated circuit package on the second integrated circuit package;
  a second encapsulation to cover the first integrated circuit package and second integrated circuit package;
  a recess in the second encapsulation exposing a substrate of the second integrated circuit package; and
  the third integrated circuit package connected to the substrate.

10. The system as claimed in claim 9 wherein the first interface with the second interface comprises:
  the first interface defined by a first electrical interface pattern on a first substrate of the first integrated circuit package;
  the second interface defined by a second electrical interface pattern on a second substrate of the second integrated circuit package; and
  the first electrical interface pattern mated with the second electrical interface pattern.

11. The system as claimed in claim 9 wherein:
the first integrated circuit package having the first interface comprises:
the first interface defined by a first electrical interface pattern on a first substrate of the first integrated circuit package;
the second integrated circuit package having the second interface further comprises:
the second interface defined by a second electrical interface pattern on a second substrate of the second integrated circuit package;
the first interface fitted with the second interface further comprises:
the first electrical interface pattern mated with the second electrical interface pattern; and
the third integrated circuit package on the second integrated circuit package further comprises:
the third integrated circuit package having a third electrical interface pattern on the second integrated circuit package; and
further comprising:
a fourth integrated circuit package having a fourth electrical interface pattern on the third integrated circuit package;
the third electrical interface pattern mated with the fourth electrical interface pattern; and
an encapsulation to cover the first integrated circuit package, the second integrated circuit package, the third integrated circuit package, and the fourth integrated circuit package.

12. The system as claimed in claim 9 wherein:
the first integrated circuit package having the first interface comprises:
the first interface defined by a first electrical interface pattern on a first substrate of the first integrated circuit package;
the second integrated circuit package having the second interface further comprises:
the second interface defined by a second electrical interface pattern on a second substrate of the second integrated circuit package;
the first interface fitted with the second interface further comprises:
the first electrical interface pattern mated with the second electrical interface pattern; and
the third integrated circuit package on the second integrated circuit package further comprises:
the third integrated circuit package having a third electrical interface pattern on the second integrated circuit package; and
further comprising:
an encapsulation to cover the first integrated circuit package, the second integrated circuit package, and the third integrated circuit package,
a recess in the encapsulation to expose the third electrical interface pattern on a third substrate of the third integrated circuit package,
a fourth integrated circuit package having a fourth electrical interface pattern in the recess on the third integrated circuit package, and
a portion of the third electrical interface pattern mated with the fourth electrical interface pattern.

13. The system as claimed in claim 9 wherein:
the first integrated circuit package having the first interface has a first integrated circuit die;
the second integrated circuit package having the second interface above the first integrated circuit package has a second integrated circuit die;
the first interface fitted with the second interface is a compatible interface; and
the third integrated circuit package on the second integrated circuit package has a third integrated circuit die; and
further comprising:
the first integrated circuit package electrically connected to the second integrated circuit package.

14. The system as claimed in claim 13 wherein:
the first integrated circuit package having the first interface comprises:
the first interface defined by a first electrical interface pattern on a first substrate of the first integrated circuit package; and
the second integrated circuit package having the second interface above the first integrated circuit package further comprises:
the second integrated circuit package with a second integrated circuit die having a second electrical interface pattern, and
the second interface defined by the second electrical interface pattern; and
further comprising:
an encapsulation to cover the first integrated circuit package, the second integrated circuit package, and the third integrated circuit package;
a recess in the encapsulation to expose the third electrical interface pattern on a third substrate of the third integrated circuit package;
a fourth integrated circuit package having a fourth electrical interface pattern in the recess on the third integrated circuit package; and
a portion of the third electrical interface pattern mated with the fourth electrical interface pattern.

15. The system as claimed in claim 13 wherein the third integrated circuit package on the second integrated circuit package includes an interconnect between the third integrated circuit package and the second integrated circuit package.

16. The system as claimed in claim 13 further comprising the first integrated circuit package on a package substrate.

17. The system as claimed in claim 13 further comprising an interconnect between the first integrated circuit package and a package substrate.

* * * * *

UNITED STATES PATENT AND TRADEMARK OFFICE
CERTIFICATE OF CORRECTION

PATENT NO. : 7,288,835 B2  Page 1 of 1
APPLICATION NO. : 11/276941
DATED : October 30, 2007
INVENTOR(S) : Yim et al.

It is certified that error appears in the above-identified patent and that said Letters Patent is hereby corrected as shown below:

<u>Column 9</u>
Line 53, delete "11108" and insert therefor --1108--

<u>Column 10</u>
Claim 1, line 55, delete "circuits" and insert therefor --circuit--

Signed and Sealed this

Twenty-fifth Day of December, 2007

JON W. DUDAS
*Director of the United States Patent and Trademark Office*